United States Patent [19]
Watanabe

[11] Patent Number: 5,870,295
[45] Date of Patent: Feb. 9, 1999

[54] SIMPLE CHARGE-PUMP CIRCUIT WITH VARIABLE CONDUCTION PATH FOR CHANGING BOOSTING RATIO AND STEP-UP CIRCUIT USING THE SAME

[75] Inventor: Toshio Watanabe, Tokyo, Japan

[73] Assignee: NEC Corporation, Tokyo, Japan

[21] Appl. No.: 861,610

[22] Filed: May 22, 1997

[30] Foreign Application Priority Data

May 22, 1996 [JP] Japan .................................. 8-126940

[51] Int. Cl.$^6$ .................................................. H02M 3/18
[52] U.S. Cl. ............................................. 363/60; 307/110
[58] Field of Search ........................ 363/59, 60; 307/110; 327/536

[56] References Cited

U.S. PATENT DOCUMENTS 5,463,542  10/1995  Okamoto ................................... 363/60
5,606,491  2/1997   Ellis ........................................... 363/60
5,635,776  6/1997   Imi ........................................... 307/110

FOREIGN PATENT DOCUMENTS 4-304161  10/1992  Japan .
4-317560  11/1992  Japan .
5-304648  11/1993  Japan .

*Primary Examiner*—Stuart N. Hecker

[57] ABSTRACT

A pattern generator is responsive to a control signal so as to change a pulse signal pattern selectively supplied through a level-shift circuit to switching elements of a charge-pump circuit, and the switching elements cause boosting capacitors to be differently charged depending upon the pulse signal pattern so that all the boosting capacitors participate in the boosting operation regardless of the target ratio between the input potential and the output potential.

5 Claims, 12 Drawing Sheets

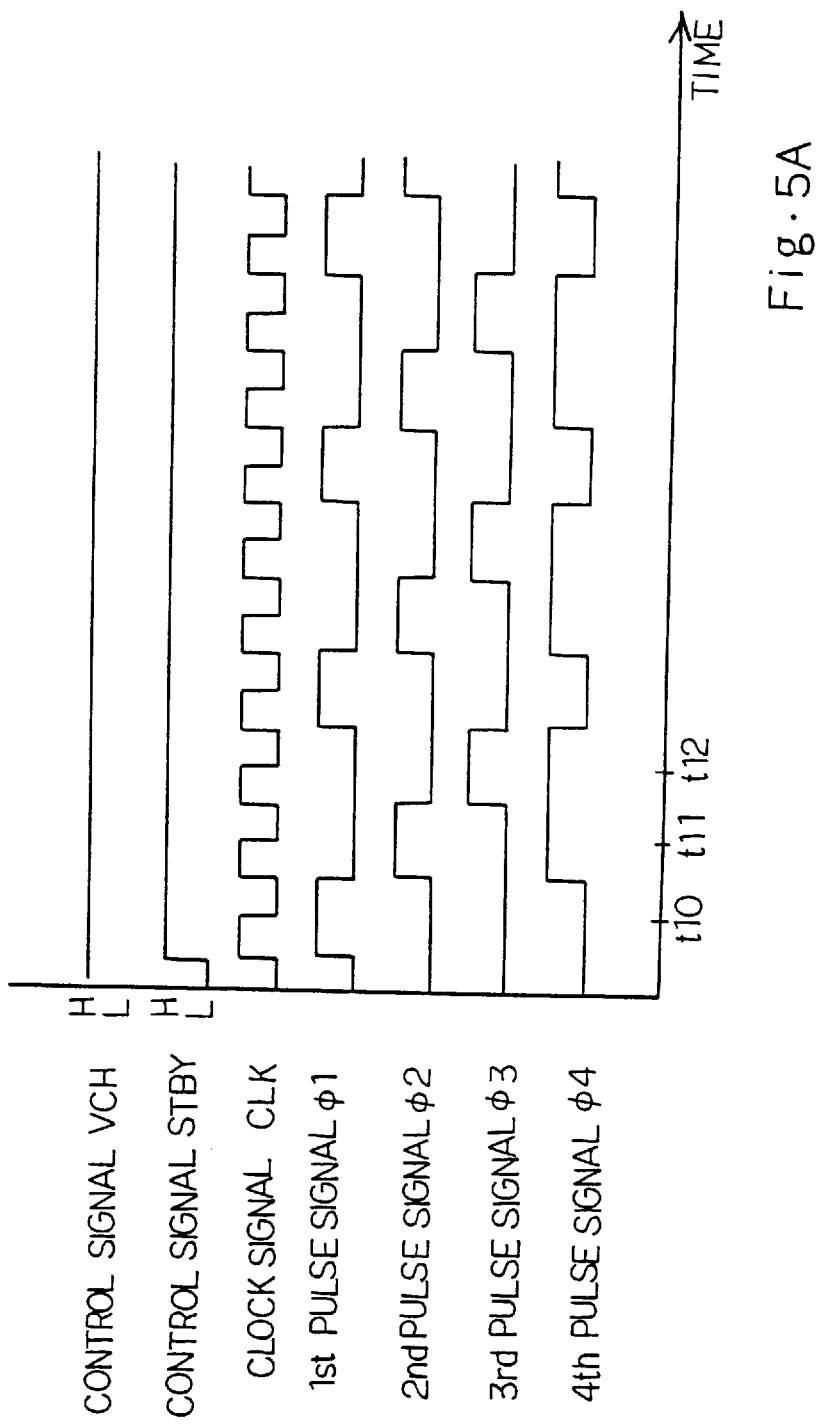

SIMPLE CHARGE-PUMP CIRCUIT WITH VARIABLE CONDUCTION PATH FOR CHANGING BOOSTING RATIO AND STEP-UP CIRCUIT USING THE SAME

FIELD OF THE INVENTION

This invention relates to a charge-pump circuit and, more particularly, to a step-up circuit having a charge-pump circuit which achieves a step-up ratio variable in dependence on a control signal pattern.

DESCRIPTION OF THE RELATED ART

A typical example of the charge-pump circuit is disclosed in Japanese Patent Publication of Unexamined Application (JPA) NO. 4-317560, and the prior art charge-pump circuit is illustrated in FIG. 1 of the drawings.

The prior art charge-pump circuit comprises three boosting capacitors C1 to C3, a smoothing capacitor C4 and eleven switching elements S1 to S11, and boosts an input potential VIN supplied from an input potential source IN. An output potential VOUT is output from the output node OUT, and the ratio of the input potential to the output potential VOUT/VIN is changed between four and three.

When the ratio of the input potential to the output potential VOUT/VIN is selected to be four, the first clock signal phi-1, the second clock signal phi-2, the third clock signal phi-3 and the fourth clock signal phi-4 are selectively supplied to the switching elements S1 to S11, and are changed as shown in FIG. 2A. With the first, second and third clock signals phi-1, phi-2 and phi-3, the prior art charge-pump circuit behaves as follows. Firstly, the first, second and third clock signals phi-1, phi-2 and phi-3 are respectively supplied to the switching elements S1 to S6, S7/S8 and S9/S10 at timing t1, and the fourth clock signal phi-4 of low level is continuously supplied to the switching element S11. Then, the boosting capacitors C1 to C3 are charged with the input potential VIN. Thereafter, the first, second and third clock signals are changed at timing t2, and the input potential source IN and the boosting capacitors C1 to C3 are connected in series. As a result, the output node OUT is boosted to the potential level VOUT.

When the ratio of the input potential to the output potential VOUT/VIN is selected to be three, the first clock signal phi-1, the second clock signal phi-2, the third clock signal phi-3 and the fourth clock signal phi-4 are selectively supplied to the switching elements S1 to S11, and are changed as shown in FIG. 2B. With the first, second and fourth clock signals phi-1, phi-2 and phi-4, the prior art charge-pump circuit behaves as follows. Firstly, the first, second and fourth clock signals phi-1, phi-2 and phi-4 are respectively supplied to the switching elements S1 to S6, S7/S8 and S11 at timing t3, and the third clock signal phi-3 of low level is continuously supplied to the switching elements S9 and S10. Then, the boosting capacitors C1 and C2 are charged with the input potential VIN. Thereafter, the first, second and fourth clock signals are changed at timing t4, and the input potential source IN and the boosting capacitors C1 and C2 are connected in series. As a result, the output node OUT is boosted to the potential level VOUT. The boosting capacitor C3 is not used.

Thus, the constant input potential VIN is supplied to the prior art charge-pump circuit regardless of the ratio of the input potential to the output potential VOUT/VIN, and the ratio VOUT/VIN is dependent on the number of boosting capacitor C1 to C4 participating in the boosting operation. This means that the prior art charge-pump circuit requires the boosting capacitors increased together with the ratio of the input potential to the output potential VOUT/VIN, and the switching elements are also increased together with the boosting capacitors C1 to C4. Therefore, the first problem inherent in the prior art charge-pump circuit is a complicated circuit configuration implemented by the circuit components increased with the ratio of the input potential to the output potential VOUT/VIN. Accordingly, when the prior art charge-pump circuit is integrated on a semiconductor chip, the large number of circuit components occupy a large-sized semiconductor chip.

SUMMARY OF THE INVENTION

It is therefore an important object of the present invention to provide a step-up circuit which achieves a variable ratio between an input potential and an output potential without increase of the circuit components.

To accomplish the object, the present invention proposes to differently connect boosting capacitors in dependence on a step-up ratio.

In accordance with one aspect of the present invention, there is provided a charge-pump circuit connected to a source of a first input potential and a source of a second input potential and responsive to first, second and third control signals for producing an output potential at an output node and comprising a first boosting capacitor having first and second electrodes electrically isolated from each other, a second boosting capacitor having third and fourth electrodes electrically isolated from each other, a first switching circuit connected between the source of the first input potential, the source of the second input potential and the first and second electrodes, and responsive to the first control signal so as to selectively charge the first and second electrodes to the first input potential, a second switching circuit connected between the source of the second input potential, the first electrode and the third and fourth electrodes, and responsive to the second control signal so as to charge the third electrode to one of the first input potential and an intermediate potential between the first input potential and the output potential in cooperation with the first switching circuit and a third switching circuit connected between the third electrode and the output node, and responsive to the third control signal so as to produce the output potential from one of the first input potential and the intermediate potential in cooperation with the second switching circuit.

In accordance with another aspect of the present invention, there is provided a step-up circuit for producing an output potential from a first input potential, comprising a pattern generating means for selectively generating a first signal pattern of first, second and third control signals and a second signal pattern of the first, second and third control signals, and a charge-pump circuit connected to a source of the first input potential and a source of a second input potential, responsive to first, second and third control signals for producing an output potential at an output node, and the charge pump circuit includes a first boosting capacitor having first and second electrodes electrically isolated from each other, a second boosting capacitor having third and fourth electrodes electrically isolated from each other, a first switching circuit connected between the source of the first input potential, the source of the second input potential and the first and second electrodes and responsive to the first control signal so as to selectively charge the first and second electrodes to the first input potential, a second switching circuit connected between the source of the second input potential, the first electrode and the third and fourth electrodes and responsive to the second control signal so as to charge the third electrode to one of the first input potential and an intermediate potential between the first input potential and the output potential in cooperation with the first switching circuit, and a third switching circuit connected between the third electrode and the output node, and responsive to the third control signal so as to produce the output potential from one of the first input potential and the intermediate potential in cooperation with the second switching circuit.

BRIEF DESCRIPTION OF THE DRAWINGS

The features and advantages of the step-up circuit according to the present invention will be more clearly understood from the following description taken in conjunction with the accompanying drawings in which:

FIGS. 5A and 5B are diagrams showing first to fourth pulse signals changed in different patterns;

DESCRIPTION OF THE PREFERRED EMBODIMENTS

First Embodiment

Figure 1:
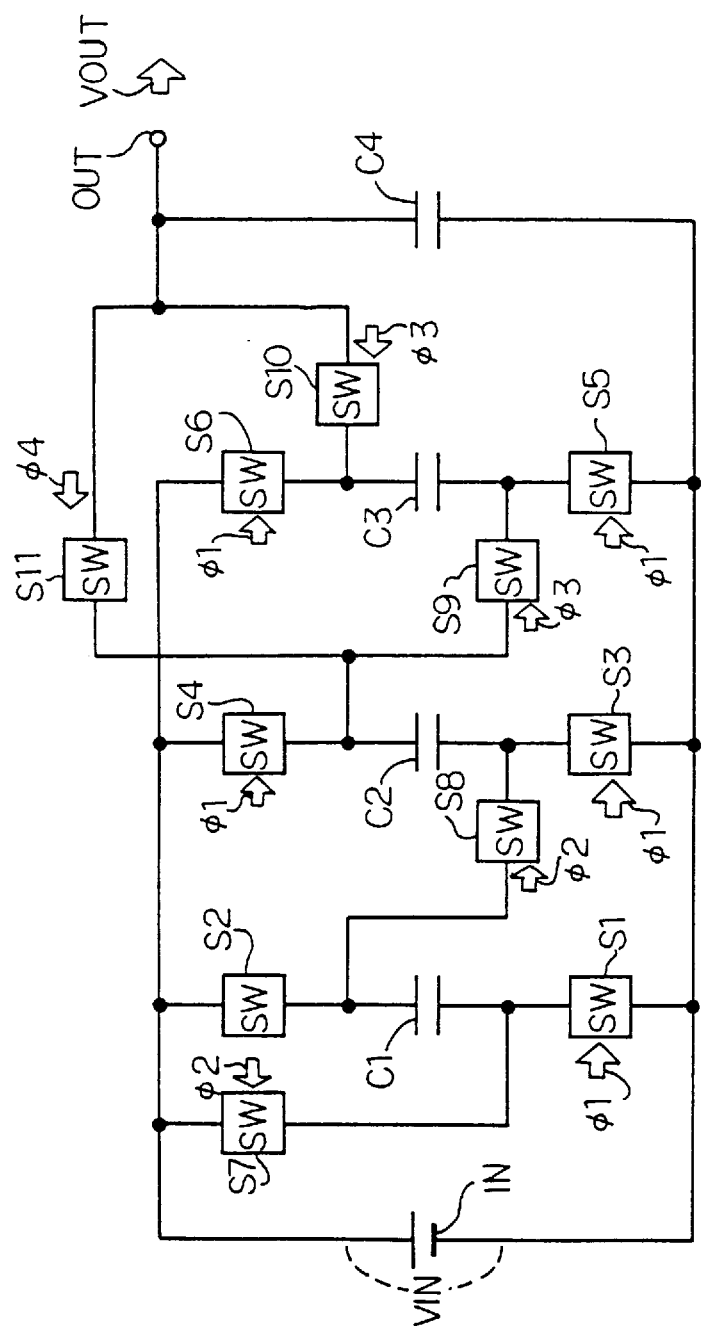
FIG. 1 is a circuit diagram showing the circuit configuration of the prior art charge-pump circuit.
Figure 2A:
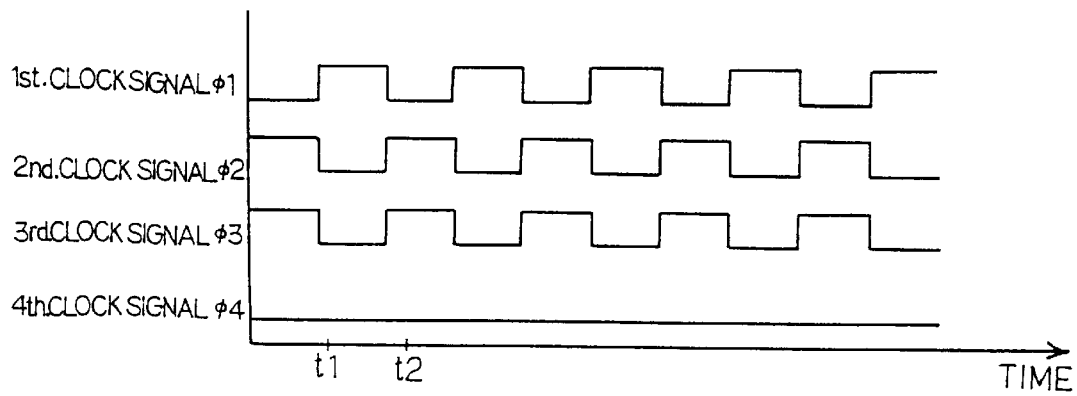
FIGS. 2A and 2B are diagrams showing the boosting operation of the prior art charge-pump circuit.
Figure 2B:
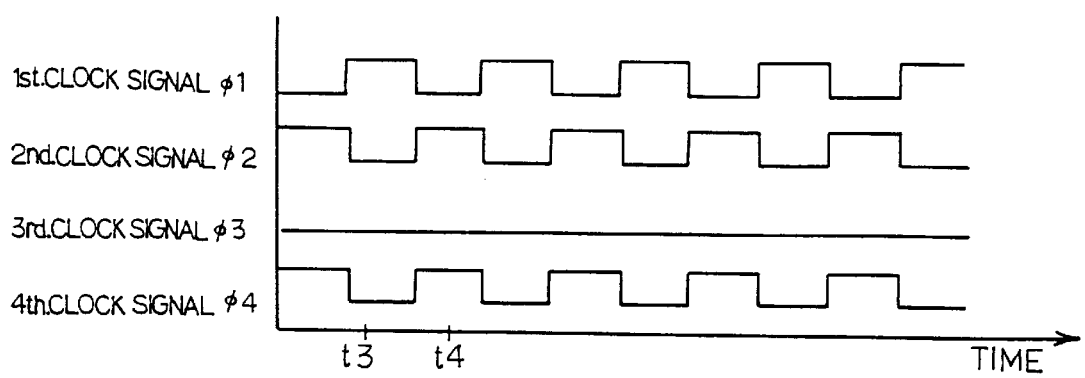
Figure 3:
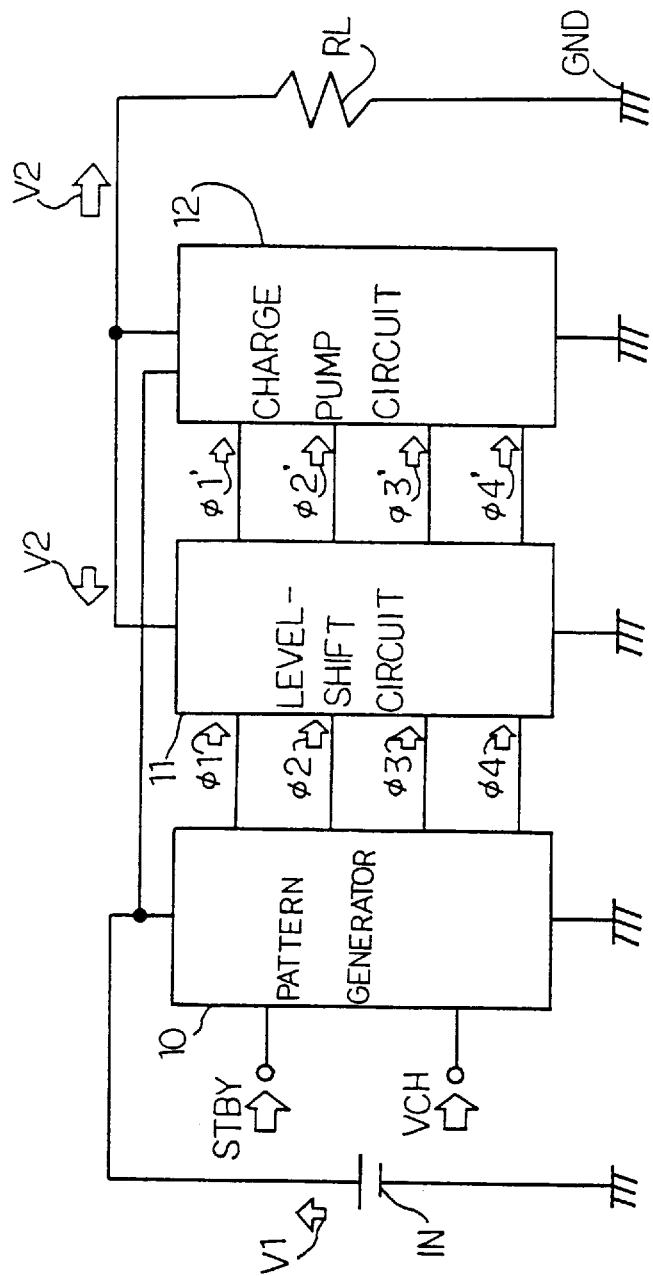
FIG. 3 is a block diagram showing the circuit arrangement of a step-up circuit according to the present invention.

Referring to FIG. 3 of the drawings, a step-up circuit embodying the present invention largely comprises a pattern generator 10, a level-shift circuit 11 and a charge-pump circuit 12. An input potential source IN is connected to the pattern generator 10, and supplies an input potential V1 to the pattern generator 10. On the other hand, the charge-pump circuit 12 is connected to a load RL, and supplies an output potential V2 through the load RL to the ground GND.

The pattern generator 10 is responsive to control signals STBY and VCH so as to produce first, second, third and fourth pulse signals phi-1, phi-2, phi-3 and phi-4. The first pulse signal phi-1 to the fourth pulse signal phi-4 swing the potential level thereof between the input potential V1 and the ground potential.

Figure 4:
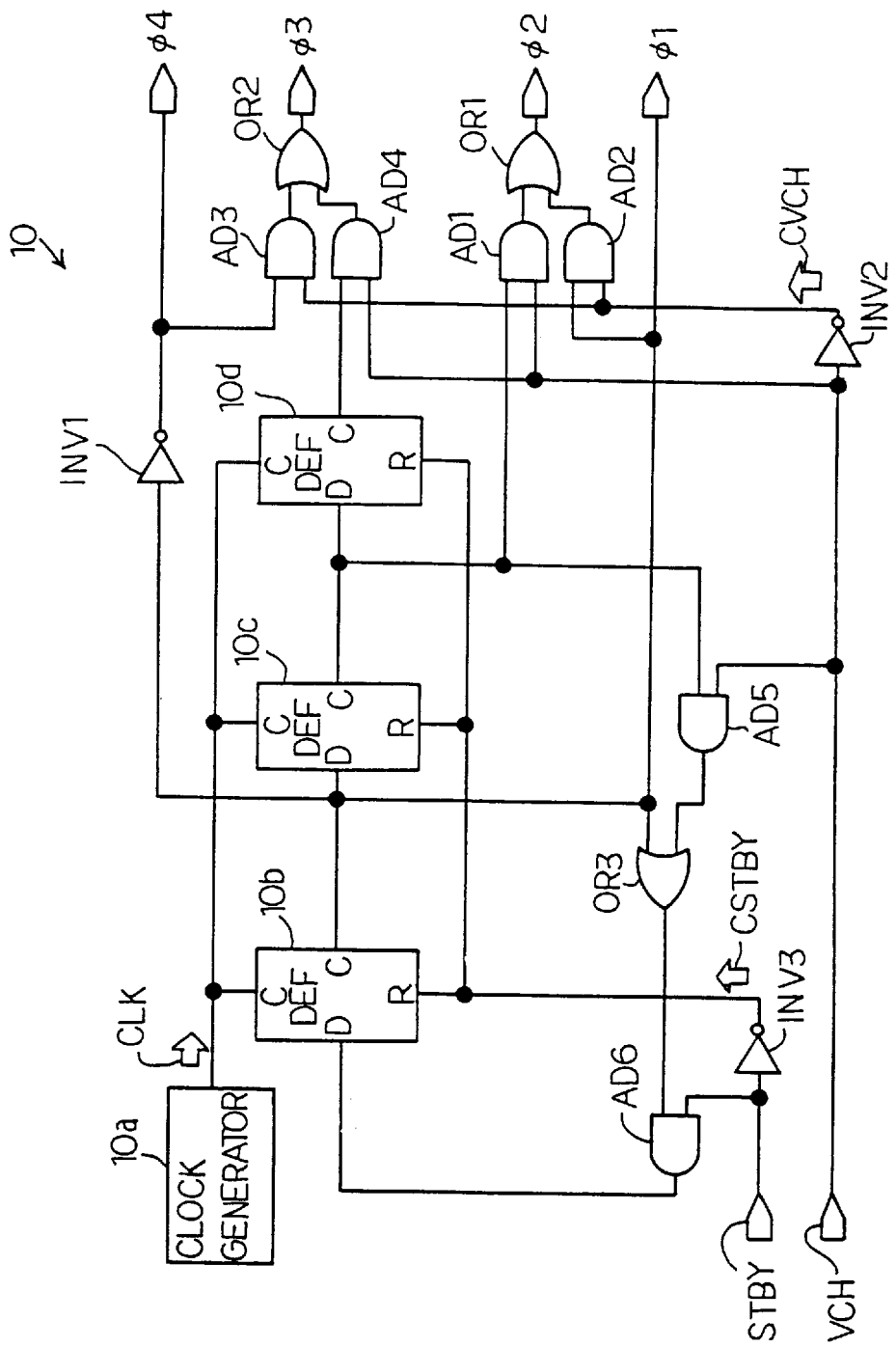
FIG. 4 is a circuit diagram showing the circuit configuration of a pattern generator incorporated in the step-up circuit.

FIG. 4 illustrates the circuit configuration of the pattern generator 10, and the pattern generator 10 is responsive to control signals STBY and VCH so as to produce two kinds of control signal pattern. The pattern generator 10 includes a clock generator 10a for producing a clock signal CLK and delay flip flop circuits 10b/10c/10d supplied with the clock signal CLK. The C node of the delay flip flop circuit 10b is connected to the D node of the next delay flip flop circuit 10c, and the C node of the delay flip flop circuit 10c is connected to the C node of the next delay flip flop circuit 10d.

The first pulse signal phi-1 is supplied from the C-node of the delay flip flop circuit 10b, and an inverter INVL produces the fourth pulse signal phi-4 from the first pulse signal phi-1.

The control signal VCH is supplied to an inverter INV2, and the inverter INV2 produces a complementary control signal CVCH from the control signal VCH. On the other hand, an inverter INV3 produces a complementary control signal CSTBY from the control signal STBY, and the complementary control signal CSTBY is supplied to the R node of the delay flip flop circuit 10b.

Two AND gates AD1/AD2 are supplied with the output signal of the delay flip flop circuit 10c, the control signal VCH, the first pulse signal phi-1 and the complementary control signal CVCH, and the output signals of the AND gates AD1/AD2 are ANDed with each other so as to produce the second pulse signal phi-2.

The output signal of the delay flip flop circuit 10d, the control signal VCH, the complementary control signal ICVCH and the fourth pulse signal phi-4 are supplied to AND gates AD3/AD4, and an OR gate OR2 produces the third pulse signal phi-3 from the output signals of the AND gates AD3/AD4.

The control signal VCH is ANDed with the output signal of the delay flip flop circuit 10c by an AND gate AD5, and the output signal of the AND gate AD5 is ORed with the output signal of the delay flip flop circuit 10b by an OR gate OR3. The output signal of the OR gate OR3 is ANDed with the control signal STBY by an AND gate AD6, and the output signal of the AND gate AD6 is supplied to the D node of the delay flip flop circuit 10b.

The control signal STBY is changed between a high level and a low level. When the control signal STBY is changed from the low level to the high level, the pattern generator 10 produces the first to fourth pulse signals phi-1 to phi-4, and the step-up circuit starts the boosting operation. On the other hand, if the control signal STBY is recovered to the low level, the step-up circuit stops the boosting operation.

Figure 5B:
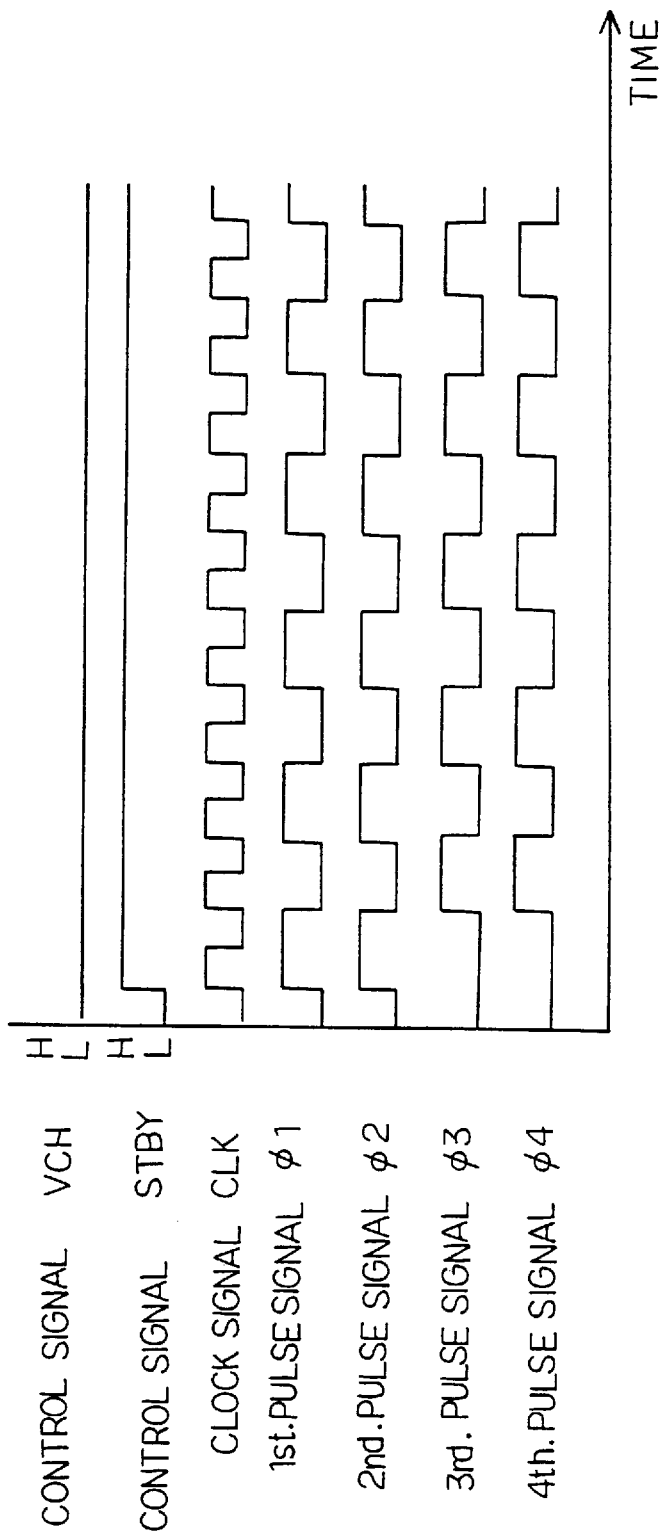

The other control signal VCH is indicative of a pattern of the pulse signals phi-1 to phi-4 and, accordingly, the ratio of the input potential to the output potential V2/V1. The other control signal VCH is changed between the high level and the low level. When the control signal VCH is in the high level, the pattern generator 11 produces the first pulse signal phi-1 to the fourth pulse signal phi-4 in the pattern shown in FIG. 5A. On the other hand, when the control signal VCH is in the low level, the pattern generator 11 produces the first pulse signal phi-1 to the fourth pulse signal phi-4 in the different pattern shown in FIG. 5B.

The level shift circuit 11 is powered with the output potential V2, and changes the first pulse signal phi-1 to the fourth pulse signal phi-4 between the input potential V1 and the ground potential to a first pulse signal phi-1' to a fourth pulse signal phi-4' between the output potential V2 and the ground potential. However, the pattern is not changed between the first to fourth pulse signals phi-1 to phi-4 and the first to fourth pulse signals phi-1' to phi-4'.

Figure 6:
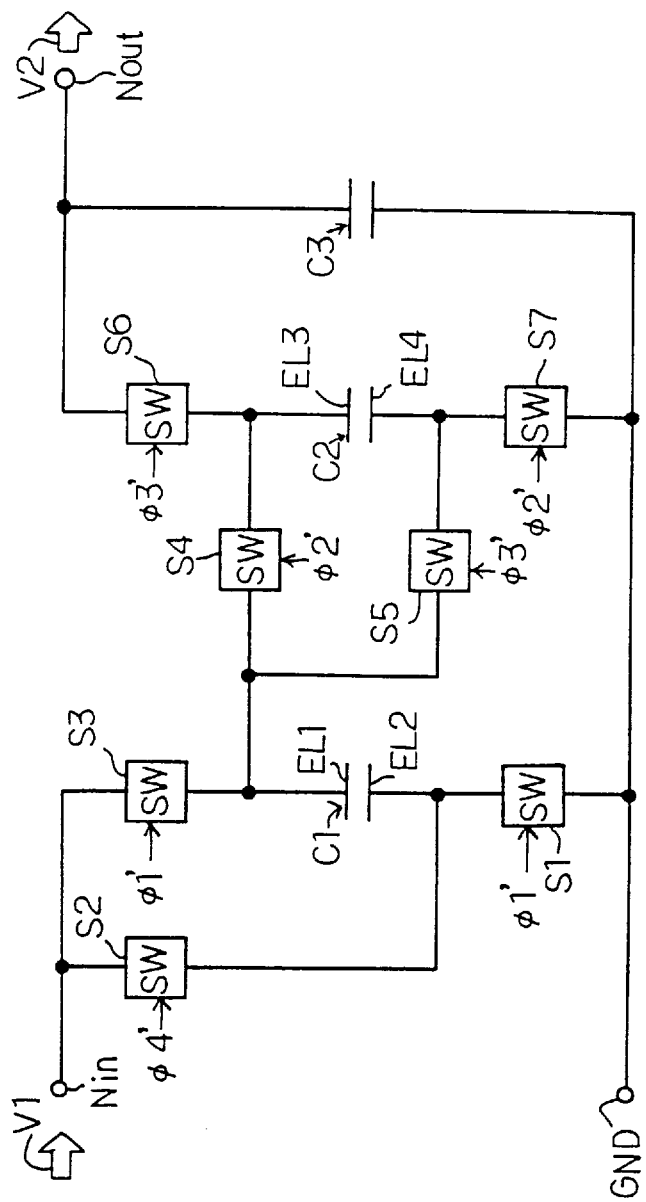
FIG. 6 is a circuit diagram showing the circuit configuration of a charge-pump circuit incorporated in the step-up circuit.

The charge-pump circuit 12 is responsive to the first pulse signal phi-1' to the fourth pulse signal phi-4' for boosting the input potential V1 to the output potential V2, and the circuit configuration thereof is illustrated in FIG. 6. The charge-pump circuit 12 comprises three capacitors C1, C2 and C3 and seven switching elements S1, S2, S3, S4, S5, S6 and S7.

The input potential node Nin is connected through the switching element S3 to the first electrode EL1 of the capacitor C1, and is further connected through the switching element S2 to the second electrode EL2 of the capacitor C1. The ground line GND is connected through the switching element S1 to the second electrode EL2 of the capacitor C1.

On the other hand, the output potential node Nout is connected through the switching element S6 to the first electrode EL3 of the capacitor C2, and the ground line GND is connected through the switching element S7 to the second electrode EL4 of the capacitor C2. The capacitor C3 is connected between the output potential node Nout and the ground line GND, and smoothes the output potential V2.

The switching element S4 is connected between the first electrode EL1 of the capacitor C1 and the first electrode EL3 of the capacitor C2, and the switching element S5 is connected between the first electrode EL1 of the capacitor C1 and the second electrode EL4 of the capacitor C2. Thus, the input potential V1 is selectively supplied to the first electrode EL1 and the second electrode EL2 of the capacitor C1, and the first electrode EL1 of the capacitor C1 is selectively connected through the switching elements S4 and S5 to the first electrode EL3 and the second electrode EL4 of the capacitor C2.

The first pulse signal phi-1', the second pulse signal phi-2', the third pulse signal phi-3' and the fourth pulse signal phi-4' are supplied to the switching elements S1/S3, the switching elements S4/S7, the switching elements S5/S6 and the switching element S2, respectively, and change the switching transistors S1 to S7 between on-state and off-state. When the pattern for the first to fourth pulse signals phi-1 to phi-4 is changed, the switching elements S1 to S7 change a conduction path between the input potential node Nin and the output potential node Nout, and the capacitors C1 and C2 are differently charged with potentials. For this reason, the ratio of the input potential to the output potential V2/V1 is changed depending upon the pattern of the first to fourth pulse signals phi-1 to phi-4.

Figure 7:
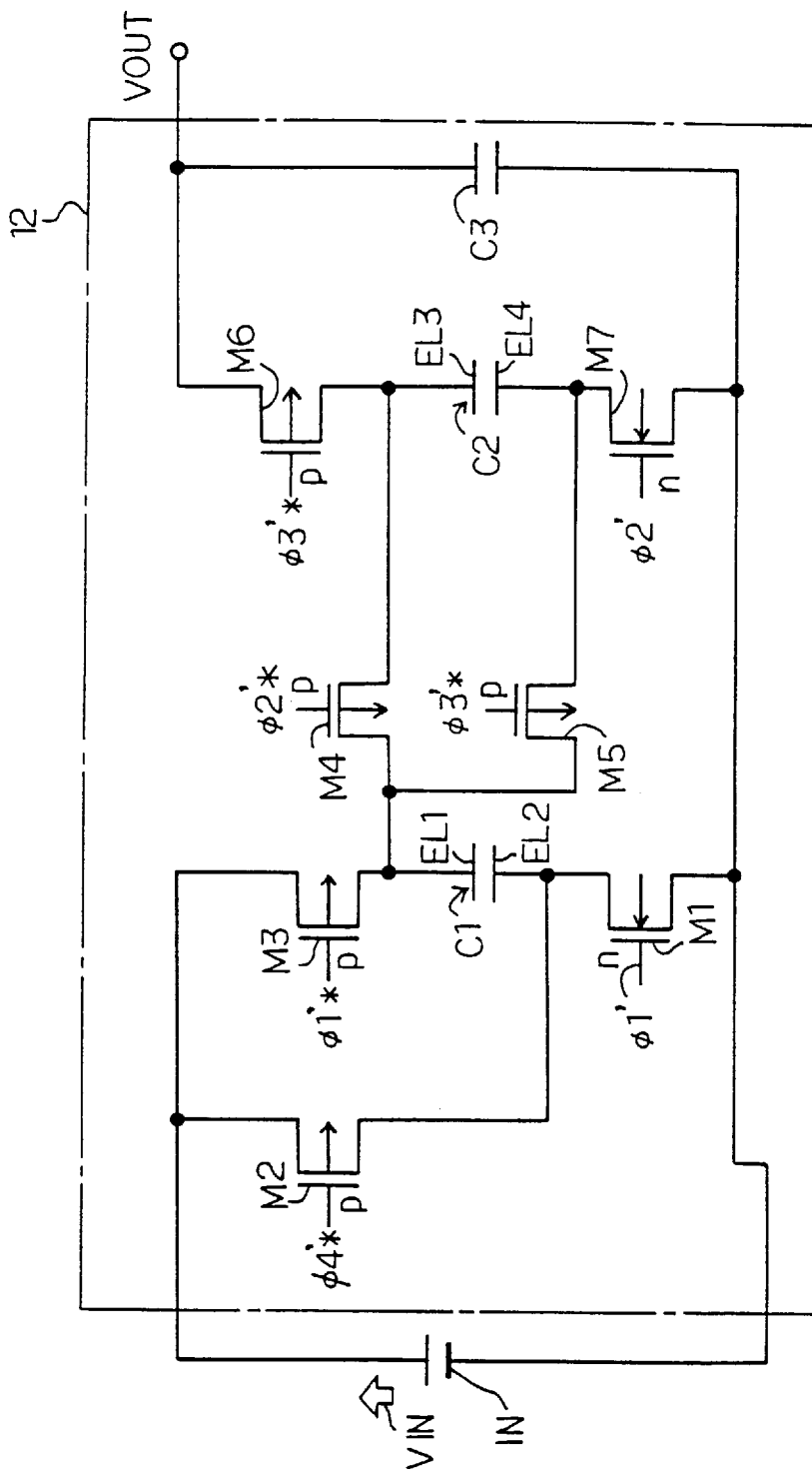
FIG. 7 is a circuit diagram showing the circuit configuration of the charge-pump circuit implemented by field effect transistors.

In this instance, field effect transistors M1 to M7 serve as the switching elements as shown in FIG. 7. The field effect transistors M1 and M2 are of the n-channel enhancement type, and are responsive to the pulse signals phi-1' and phi-2' of the active high level so as to turn on. On the other hand, the field effect transistors M2, M3, M4, M5 and M6 are of the p-channel enhancement type, and, accordingly, are responsive to the pulse signals phi-4', phi-1', phi-2', phi-3' of the active low level so as to turn on. The pulse signals of the active low level are represented by * such as phi-4'*, phi-1'*, phi-2' * and phi-3'* in FIG. 7.

The step-up circuit behaves as follows. Assuming now that both of the control signals STBY and VCH are in the high level, the pattern generator 10 changes the first to fourth pulse signals phi-1 to phi-4 at time t10, and the level shift circuit 11 selectively supplies the first to fourth pulse signals phi-1' to phi-4' to the switching elements S1 to S7 of the charge-pump circuit 12. Then, the input potential source IN is connected to the capacitor C1, and charges the capacitor C1 to V1.

The pattern generator 10 changes the first to fourth pulse signals phi-1 to phi-4 at time t11, and the level-shift circuit 11 selectively supplies the first to fourth pulse signals phi-1' to phi-4' to the switching elements S1 to S7 of the change-pump circuit 12. Then, the capacitor C1 is connected in series to the capacitor C2 as shown in FIG. 8B, and the capacitor C2 is charged to 2V1.

The pattern generator 10 changes the first to fourth pulse signals phi-1 to phi-4 at time t12, and the level-shift circuit 11 selectively supplies the first to fourth pulse signals phi-1' to phi-4' to the switching elements S1 to S7 of the change-pump circuit 12. Then, the input potential source IN and the capacitors C1 and C2 are connected in series as shown in FIG. 8C, and the output potential V2 is boosted to 4V1.

Figure 8A:
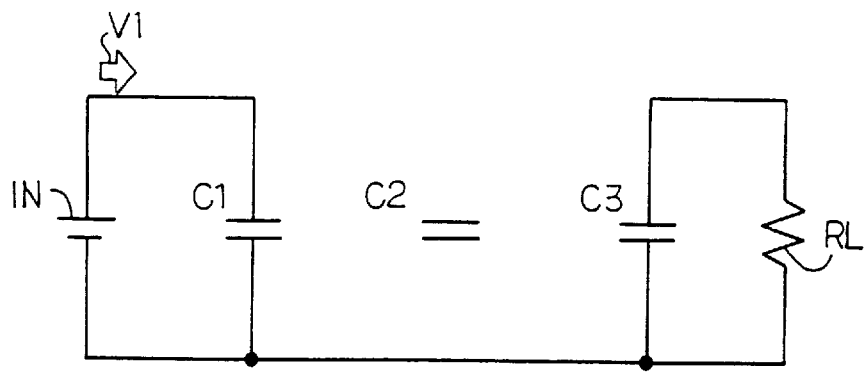
FIGS. 8A to 8C are views showing a boosting operation under a control signal pattern.
Figure 8B:
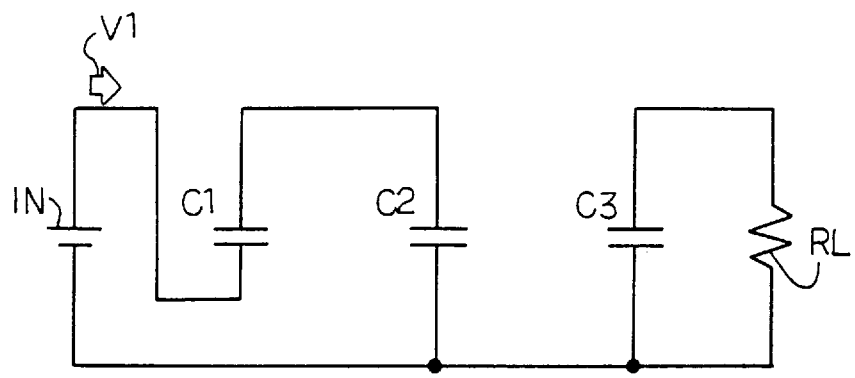
Figure 8C:
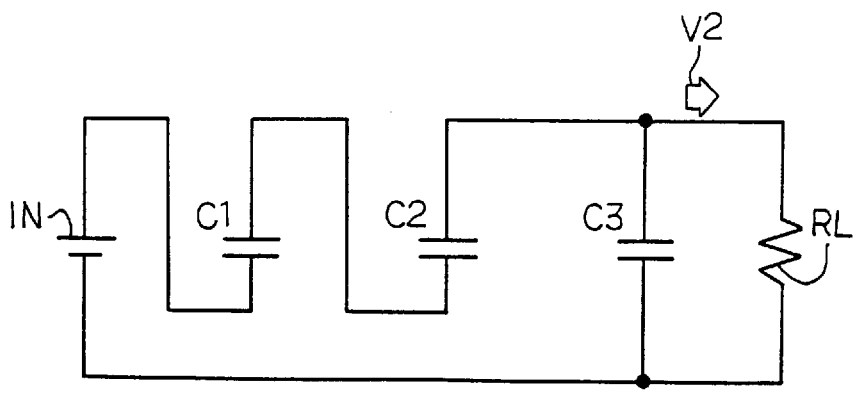

The first to fourth pulse signals phi-1 to phi-4 cause the charge-pump circuit 12 to repeat the loop shown in FIGS. 8A to 8C, and the step-up circuit achieves the input potential to the output potential ratio of "4".

On the other hand, if the control signal VCH is changed to the low level, the pattern generator 10 changes the first to fourth pulse signals phi-1 to phi-4 at time t21, and the level-shift circuit 11 selectively supplies the first to fourth pulse signals phi-1' to phi-4' to the switching elements S1 to S7 of the change-pump circuit 12. Then, the input potential source IN is connected to the capacitors C1 and C2 as shown in FIG. 9A, and the capacitors C1 and C2 are charged to V1.

The pattern generator 10 changes the first to fourth pulse signals phi-1 to phi-4 at time t22, and the level-shift circuit 11 selectively supplies the first to fourth pulse signals phi-1' to phi-4' to the switching elements S1 to S7 of the change-pump circuit 12. Then, the input potential source IN and the parallel combination of capacitors C1/C2 are connected in series as shown in FIG. 9B, and the output potential V2 is boosted to 3V1.

Figure 9A:
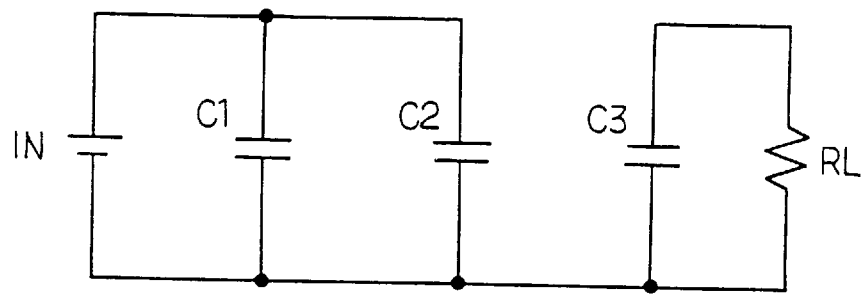
FIGS. 9A and 9B are views showing a boosting operation under another control signal pattern.
Figure 9B:
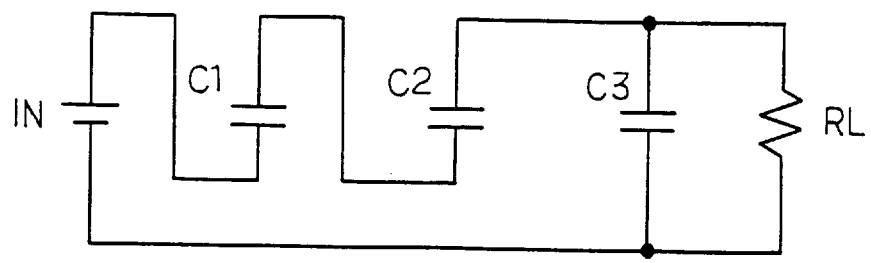

The first to fourth pulse signals phi-1 to phi-4 cause the charge-pump circuit 12 to repeat the loop shown in FIGS. 9A and 9B, and the step-up circuit achieves the input potential to the output potential ratio of "3".

As will be appreciated from the foregoing description, the pattern generator 10 selectively produces the two kinds of control signal pattern, and the charge-pump circuit 12 changes the conduction path for charging the capacitors C1/C2. The capacitor C2 is charged to 2V1 or V1 depending upon the conduction path, and the input potential to the output potential ratio is changed between 4 and 3. All the capacitors C1 and C2 participate the boosting operation regardless of the ratio, and no boosting capacitor stands idle. As a result, the number of circuit components are decreased, and the simple step-up circuit is integrated on a small semiconductor chip.

In this instance, the switching elements S1, S2 and S3 as a whole constitute a first switching circuit, and the switching elements S4, S5 and S7 form in combination a second switching circuit. The switching element serves as a third switching circuit. The first and fourth pulse signals phi-1 and phi-4 serve as a first control signal, the second and third pulse signals phi-2 and phi-3 serve as a second control signal and the third pulse signal phi-3 serves as a third control signal. The pattern generator 10 and the level shift circuit as a whole constitute a pattern generating means.

Second Embodiment

Figure 10:
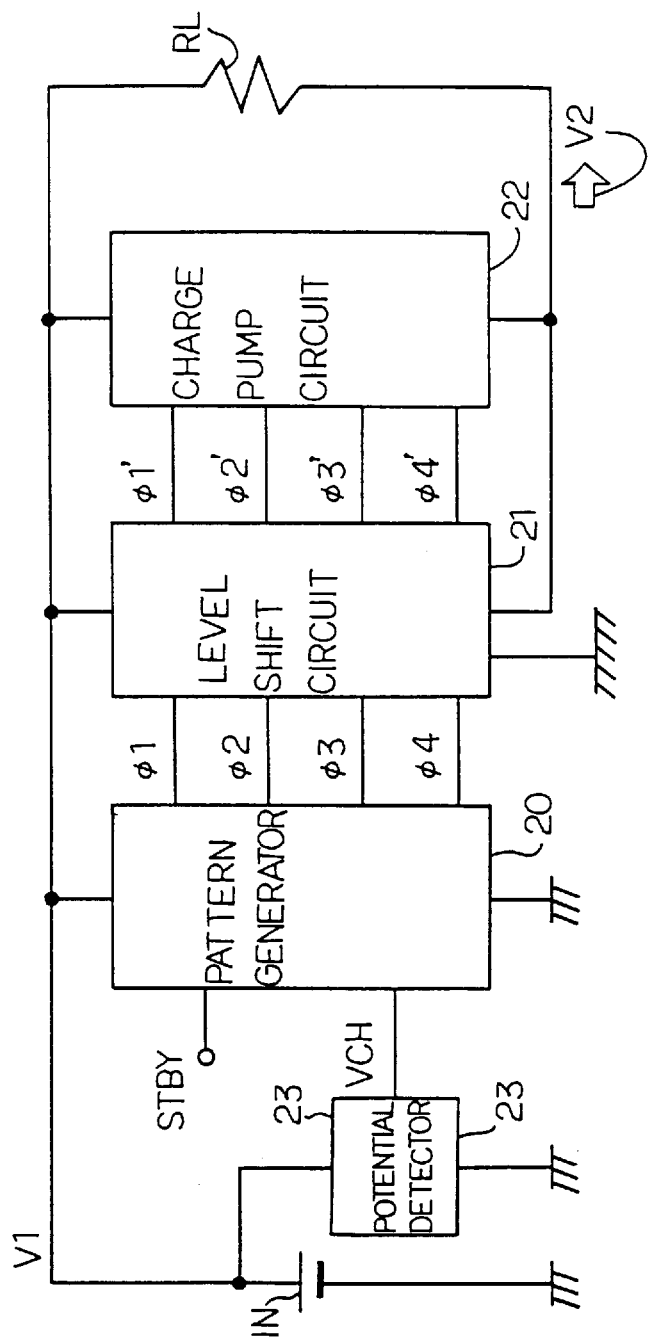
FIG. 10 is a block diagram showing the arrangement of another step-up circuit according to the present invention.

FIG. 10 illustrates another step-up circuit embodying the present invention. The step-up circuit comprises a pattern generator 20, a level-shift circuit 21, a charge-pump circuit 22 and a potential detector 23. The potential detector 23 monitors an input potential V1, and changes a control signal VCH between a high level and a low level. When the input potential V1 is equal to or higher than 4 volts, the potential detector 23 produces the control signal VCH of the high level. On the other hand, if the input potential V1 is less than 4 volts, the potential detector 23 produces the control signal VCH of the low level. The control signal VCH causes the pattern generator 20 to change a patter of pulse signals phi-1 to phi-4. Another control signal STBY serves as similar to that of the first embodiment.

The level shift circuit 21 changes the first to fourth pulse signals from the potential range between zero to V1 to another potential range between V1 to V2.

Figure 11:
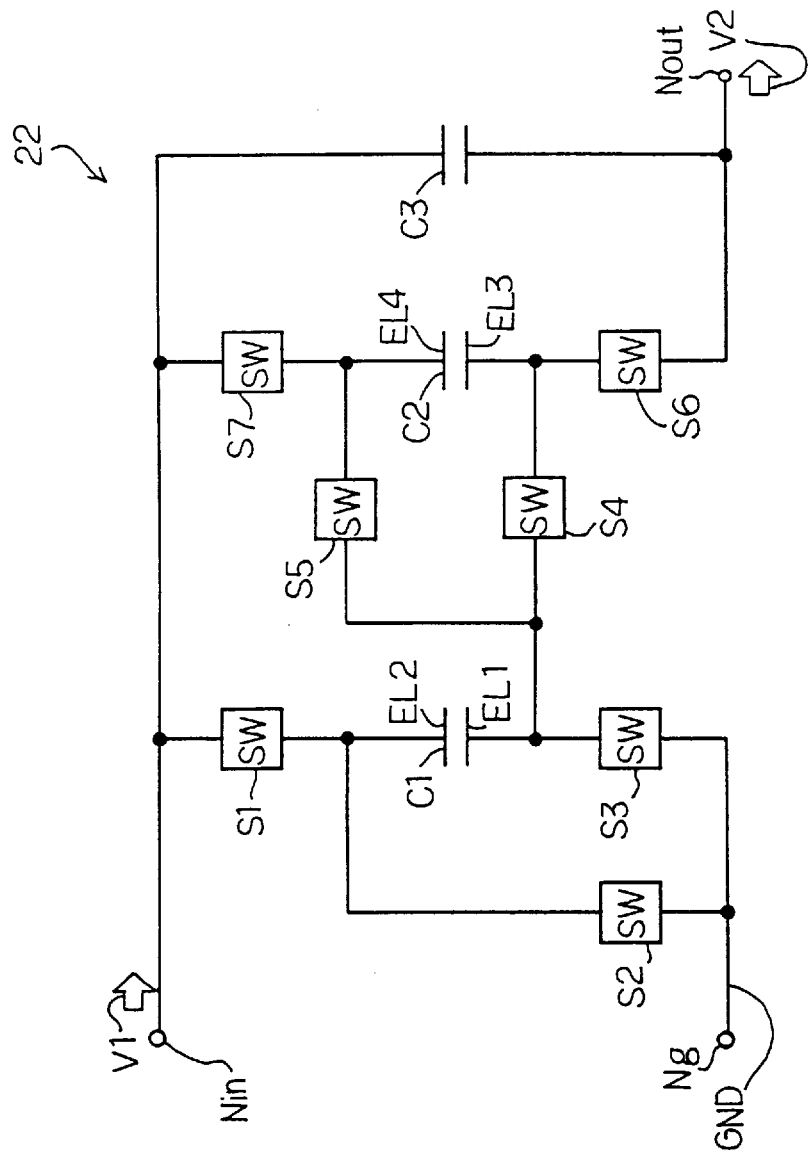
FIG. 11 is a circuit diagram showing the circuit configuration of a charge-pump circuit incorporated in the step-up circuit shown in FIG. 10.

The circuit configuration of the charge-pump circuit 22 is illustrated in FIG. 11 in detail. The charge-pump circuit 22 includes boosting capacitors C1/C2, a smoothing capacitor C3 and switching elements S1 to S7. Although the power supply line for the input potential V1 and the ground line GND are exchanged, the arrangement of the switching elements S1 to S7 is similar to that of the charge-pump circuit shown in FIG. 6.

The ground potential node Ng is connected through the switching element S3 to the first electrode EL1 of the capacitor C1, and is further connected through the switching element S2 to the second electrode EL2 of the capacitor C1. The input potential node Nin is connected through the switching element S1 to the second electrode EL2 of the capacitor C1.

On the other hand, the output potential node Nout is connected through the switching element S6 to the first electrode EL3 of the capacitor C2, and the input potential node Nin is connected through the switching element S7 to the second electrode EL4 of the capacitor C2. The capacitor C3 is connected between the input potential node Nin and the output potential node Nout, and smoothes the negative output potential V2.

The switching element S4 is connected between the first electrode EL1 of the capacitor C1 and the first electrode EL3 of the capacitor C2, and the switching element S5 is connected between the first electrode EL1 of the capacitor C1 and the second electrode EL4 of the capacitor C2. Thus, the input potential V1 is selectively supplied to the first electrode EL1 and the second electrode EL2 of the capacitor C1, and the first electrode EL1 of the capacitor C1 is selectively connected through the switching elements S4 and S5 to the first electrode EL3 and the second electrode EL4 of the capacitor C2.

The first pulse signal phi-1', the second pulse signal phi-2', the third pulse signal phi-3' and the fourth pulse signal phi-4' are supplied to the switching elements S1/S3, the switching elements S4/S7, the switching elements S5/S6 and the switching element S2, respectively, and change the switching transistors S1 to S7 between on-state and off-state. The pattern generator 20 produces the two kinds of control signal pattern shown in FIGS. 5A and 5B, and the switching elements S1 to S7 changes the conduction path between the input potential source IN and the boosting capacitors C1/C2 as shown in FIGS. 8A to 8C or 9A/9B.

Thus, the charge-pump circuit 22 is similarly controlled with the first to fourth pulse signals phi-1 to phi-4, and produces the negative output potential V2.

The step-up circuit shown in FIG. 10 automatically changes the input potential to the output potential ratio depending upon the input potential level V1. All the boosting capacitors C1/C2 participate in the boosting operation, and the circuit configuration is simple.

Although particular embodiments of the present invention have been shown and described, it will be obvious to those skilled in the art that various changes and modifications may be made without departing from the spirit and scope of the present invention.

For example, the switching elements S1 to S7 may be implemented by bipolar transistors.

If more than two boosting capacitors are increased and connected through switching elements in a similar manner to the charge-pump circuit 12, the input potential to output potential ratio is increased without an idling capacitor.

What is claimed is:

1. A step-up circuit for producing an output potential from a first input potential, comprising:

a pattern generating means for selectively generating a first signal pattern of first, second and third control signals and a second signal pattern of said first, second and third control signals, said pattern generating means including a pattern generator responsive to a first instruction signal for selectively producing said first and second signal patterns of said first, second and third control signals from a clock signal, and a level-shift circuit connected to said pattern generator circuit for changing said first, second and third control signals from a first potential range to a second potential range; and a charge-pump circuit connected to a source of said first input potential and a source of a second input potential and also connected to said pattern generator and said level-shift circuit to receive therefrom said first signal pattern and said second signal pattern of said first, second and third control signals for producing an output potential at an output node, said charge pump circuit including:

a first boosting capacitor having first and second electrodes electrically isolated from each other, a second boosting capacitor having third and fourth electrodes electrically isolated from each other, a first switching circuit connected between said source of said first input potential, said source of said second input potential and said first and second electrodes and responsive to said first control signal so as to selectively charge said first and second electrodes to said first input potential;

a second switching circuit connected between said source of said second input potential, said first electrode and said third and fourth electrodes and responsive to said second control signal so as to charge said third electrode to one of said first input potential and an intermediate potential between said first input potential and said output potential in cooperation with said first switching circuit, and a third switching circuit connected between said third electrode and said output node, and responsive to said third control signal so as to produce said output potential from one of said first input potential and said intermediate potential in cooperation with said second switching circuit.

2. The step-up circuit as set forth in claim 1, in which said first switching circuit includes:

a first switching element connected between said source of said second input potential and said second electrode and changed from off-state to on-state in the presence of a first pulse train of said first control signal in a first level, a second switching element connected between said source of said first input potential and said second electrode and changed from the off-state to the on-state in the presence of a second pulse train of said first control signal in a second level, and a third switching element connected between said source of said first input potential and said first electrode and changed from the of-state to the on-state in the presence of said first pulse train of said first control signal in said second level;

said second switching circuit includes a fourth switching element connected between said first electrode and said third electrode and changed from the off-state to the on-state in the presence of a first pulse train of said second control signal in said second level, a fifth switching element connected between said first electrode and said fourth electrode and changed from the off-state to the on-state in the presence of a second pulse train of said second control signal in said second level, and a sixth switching element connected between said fourth electrode and said source of said second input potential and changed from the off-state to the on-state in the presence of the first pulse train of said second control signal in said first level; and said third switching circuit includes: a seventh switching element connected between said third electrode and said output node and changed from the off-state to the on-state in the presence of a pulse train of said third control signal in said second level.

3. The step-up circuit as set forth in claim 2, in which, while said pattern generating means is producing said first signal pattern, said first pulse train of said first control signal and said second pulse train of said first control signal are complementary to each other, and said first pulse train of said second control signal and said second pulse train of said second control signal are sequentially changed from said second level to said first level and recovered from said first level to said second level during said first pulse train of said first control signal remains in said second level, while said pattern generating means is producing said second signal pattern, said first pulse train of said first control signal is an in-phase signal of said first pulse train of said second control signal, said second pulse train of said first control signal is an in-phase signal of said second pulse train of said second control signal, said first pulse train of said first control signal and said first pulse train of said second control signal are complementary to said second pulse train of said first control signal and said second pulse train of said second control signal.

4. The step-up circuit as set forth in claim 3, in which said first and sixth switching elements are implemented by n-channel enhancement type field effect transistors, respectively, and said second to fifth switching elements and said seventh switching element are implemented by p-channel enhancement type switching transistors, respectively.

5. The step-up circuit as set forth in claim 1, further comprising a potential detector monitoring said first input potential and changing said first instruction signal between a first instruction representative of said first signal pattern and said a second instruction representative of said second signal pattern depending upon a level of said first input potential.

* * * * *